United States Patent [19]

Nayar

[11] 4,126,451
[45] Nov. 21, 1978

[54] MANUFACTURE OF PLATES BY POWDER-METALLURGY

[75] Inventor: Harbhajan S. Nayar, Plainfield, N.J.

[73] Assignee: Airco, Inc., Montvale, N.J.

[21] Appl. No.: 782,674

[22] Filed: Mar. 30, 1977

[51] Int. Cl.² ............................................. B22F 3/14
[52] U.S. Cl. ................................... 75/208 R; 75/214; 75/223; 75/224; 75/225; 75/226; 425/78
[58] Field of Search ..................... 425/78, 79; 75/214, 75/226, 208 R, 208 CS, 224, 225, 223

[56] References Cited

U.S. PATENT DOCUMENTS

| | | | |
|---|---|---|---|
| 2,195,297 | 3/1940 | Engle | 75/226 X |
| 2,549,596 | 4/1951 | Hamilton et al. | 75/226 X |
| 3,182,391 | 5/1965 | Charland et al. | 75/226 X |
| 3,256,088 | 6/1914 | Mackin et al. | 75/226 X |
| 3,331,686 | 7/1967 | Bonio et al. | 75/226 |
| 3,413,393 | 11/1968 | Turk | 75/226 X |
| 3,436,802 | 4/1969 | Cohn | 75/226 |
| 3,474,516 | 10/1969 | Finlay et al. | 75/226 X |
| 3,496,425 | 2/1970 | Kirkpatrick et al. | 75/214 X |
| 3,611,546 | 10/1971 | Haller | 75/214 |
| 3,671,230 | 6/1972 | Smyth et al. | 75/226 X |
| 3,676,079 | 7/1972 | Morgan | 75/226 X |
| 3,810,757 | 5/1974 | Andrews et al. | 75/208 CS |
| 3,814,598 | 6/1974 | Gabriel et al. | 75/226 X |
| 3,861,839 | 1/1975 | Malik | 425/78 |
| 3,975,193 | 8/1976 | Nayar | 75/200 X |
| 3,975,193 | 8/1976 | Nayar | 75/226 X |
| 4,008,023 | 2/1977 | Wentzell | 425/78 |
| 4,025,313 | 5/1977 | Slaats | 75/208 CS |

*Primary Examiner*—Richard E. Schafer
*Attorney, Agent, or Firm*—David A. Draegert; Edmund W. Bopp; Larry R. Cassett

[57] ABSTRACT

A powder-metallurgy process, product, and assembly particularly adapted for manufacturing plates of hard-to-work materials, such as chromium and its alloys, are disclosed. The assembly is formed by placing a metal powder into the cavity of a die and disposing one punch or two opposed punches to intrude into the cavity and enclose the powder. Preferably, the powder is compacted by applying pressure to the punches, and the punches are fixed to the die with their outer ends protruding from the die. The enclosed powder may be purified, outgassed, and sealed under vacuum. The enclosed powder is consolidated and elongated by heating and compressing, preferably by rolling one or more times in a conventional rolling mill. The composite product is cooled slowly and cut to the desired size. Remnants of the die and punch may serve as frame and backing for the consolidated powder layer. The plates have application, for example, as sputtering targets.

25 Claims, 6 Drawing Figures

DIRECTION OF TRAVEL

MANUFACTURE OF PLATES BY POWDER-METALLURGY

BACKGROUND OF THE INVENTION

The present invention is in the field of manufacturing plates of hard-to-work metals, such as chromium and its alloys, by powder-metallurgy.

The most common metal-working or fabrication processes for producing plate-like products are rolling and forging. In both these processes, a thick metal preform formed by casting or other methods is shaped into a relatively thin product by plastic deformation under the influence of applied stresses. The metal elements and alloys in use today exhibit a very wide range of workability characteristics. Some of these, such as copper, aluminum, and mild steel, are very easy to work, whereas others, such as chromium, molybdenum, tungsten, and their alloys, and some complex superalloys, are very difficult to fabricate. Processes such as open-die forging and rolling generate tensile stresses leading to tensile deformation and reduction in thickness. If the metal or alloy being worked or deformed is not sufficiently ductile under the working conditions, it will tend to fracture or develop surface or end cracks. With hard-to-work alloys, fracturing and cracking account for the greatest material loss in the fabrication process.

Open specific use of a metal plate is as a target in a sputtering apparatus, such as that described by John S. Chapin, "The Planar Magnetron", Research/Development, Vol. 25, No. 1, pp 37-40 (January 1974). In a sputtering process, an anode and a cathode or target comprising a layer of metal to be sputtered are placed in a chamber containing an ionizable gas at a reduced pressure. When the electrodes are connected to a source of electric potential, metal is removed from the target and deposited as a thin film on a substrate disposed nearby.

The currently available methods for preparing large-area sputtering targets of chromium, its alloys, and similar hard-to-work materials have distinct disadvantages. One such method involves casting plates of the sputtering material, machining them to the proper shape, and mounting one or more in an array to obtain a target of the desired size. This method is disadvantageous for the reasons that castings of chromium and the like are quite brittle, thus being very difficult to machine and tending to crack under high temperature gradients which arise during sputtering at high powers. Such cracking can cause leakage of circulating water which is used to cool the cathode during the sputtering process. Similarly, brazing or other bonding of a rolled sheet of the sputtering metal to a backing plate is disadvantageous because of the difficulty in working such materials without developing cracks and fractures. Another method involves electroplating chromium onto a backing plate. This is disadvantageous because it is exceedingly difficult to electroplate many metal elements and most alloys.

Many of the difficulties associated with the normal casting procedures for producing chromium and chromium-alloy plates can be overcome by a powder-metallurgy technique such as described by R. W. Fountain, author of Chapter 7, "Chromium", at page 106 of Rare Metals Handbook, 2nd Edition (1961), edited by Clifford A. Hampel, and published by Reinhold Publishing Corporation. Briefly, this technique involves cold-compacting the powder, usually with a binder, at pressures of 40,000 to 60,000 lb/in², and vacuum-sintering in two steps at temperatures of 2400° F. (1315° C.) and above. Typically, the product has a relatively low density, such as less than 90% of the theoretical maximum. The process requires specialized equipment, and is limited to products of relatively small areas because of the pressure required in the compacting step.

The pressure required to consolidate powder can be greatly reduced by pressing the powder while it is hot. In a paper, "Fabrication of Beryllium Sheet from Hot Pressed Powder", which appeared at pp 5–11 of Vol. 17 of "Progress in Powder Metallurgy" (Metal Powder Industries Federation 1961), B. H. Hessler and J. P. Denny describe a technique for forming billets by hot-pressing beryllium powder in a mild steel die. A billet is then machined to form a slab, encapsulated in mild steel for protection and restraint, and rolled to form a sheet of the desired thickness.

SUMMARY OF THE INVENTION

The present invention is primarily concerned with a powder-metallurgy process and an assembly for producing large-area, high-density, substantially crack-free plates or laminates of hard-to-work metal elements and alloys, such as chromium and the like. A more particular object of the invention is the manufacture of sputtering targets of hard-to-work metals.

Very briefly, these and other objects are attained by placing a metal powder into the cavity of a die and disposing at least one punch so as to partially intrude and partially protrude from the die. The assembly, comprising the punch, die, and enclosed powder, is heated and compressed by applying pressure to the punch to consolidate and elongate the powder. Preferably, the compressing step is accomplished by rolling the assembly in a conventional rolling mill.

In a preferred embodiment of the invention, the die is a hollow, rectangular structure and two punches are of such a length and width that they just fit within two rectangular cavity openings at opposite ends of the die. A layer of metal powder is placed into the cavity, and the pair of punches is disposed to intrude into the die from opposite directions.

The assembly facilitates several preliminary steps which may be performed prior to consolidating the powder. The initial density of the powder is typically only 55% or less of the theoretical maximum density. Preferably, the powder is compacted by applying pressure to the punches to increase the density to about 65% of the theoretical maximum. After compacting, each punch protrudes a distance $d_p$ and intrudes a distance $d_i$ with respect to the end of the die. Preferably, the intrusion ratio $i \equiv d_i/d_p$ is 0.5 to 2, and each punch is fixed in that position by interposing weld metal between the die and the periphery of the punch. The chemical composition of the powder may be modified by passing a reactive gas through the assembly. Preferably, the assembly is evacuated to outgas the powder and then sealed with the powder under vacuum. After these preliminary steps, the assembly is heated and compressed utilizing temperatures and pressures sufficient to consolidate the powder.

The compressing step is believed best accomplished in two stages. In the first stage, the powder compresses without substantial elongation until the density is at least 90% of the theoretical maximum. Further densification requires much higher compressive stresses or a second stage in which compressive and shearing stresses combine to reduce the thickness and elongate the powder layer. It appears that once the density of the consolidated powder layer exceeds about 90%, the layer can be deformed by shearing stresses with much less likelihood of cracking than if the density is less than 90%.

The compressing step is preferably accomplished by rolling the assembly in a conventional rolling mill. Rolling is preferred because it is possible to process large-area plates without the use of extremely high forces. This results because only a small volume of material is deformed at any instant. If the rolling mill is capable of applying sufficient pressure, the two compressing stages can be combined in a single pass. The required forces can be reduced by rolling in several passes.

In order to reduce the incidence of cracking, it is preferred that the density of the consolidated powder be increased to at least 90% of the theoretical maximum before there is substantial elongation. The density resulting from the first pass is increased either by increasing the total distance P which the punches (or punch) protrude from the die or decreasing the gap G between the rolls. Preferably, the protrusion ratio $p = P/(1-\rho_c)T_M$ is greater than about 1, and the gap ratio $g = G/T_D$ is less than about 1, where $T_D$ is the thickness of the die, $T_M$ is the thickness of the enclosed powder, $\rho_c$ is the density of the powder expressed as a fraction of the maximum theoretical density, and all quantities have the values measured just prior to rolling. A protrusion ratio $p$ in the range 1.2 to 2 and a first-pass gap ratio $g$ in the range 0.95 to 1.05 are even more preferred in order to ensure that the density of the consolidated powder exceeds 90% before the powder is subjected to substantial shearing stresses.

If a higher density or a larger area than is obtained by a first rolling is desired, the assembly is subjected to additional passes with progressively decreasing roll gaps. Such rolling substantially reduces the thickness of the die and generates shearing stresses which elongate and increase the density of the consolidated powder. After such additional rolling, the density is usually at least 95% of the theoretical maximum, and 99% has been obtained.

After the compressing step, the composite product is cooled slowly and cut carefully to minimize residual stresses and prevent cracking. Part or all of the material derived from the punches and die is removed as desired.

Although the present invention is particularly adapted to the fabrication of large-area plates and laminates of chromium and its alloys, it will be understood that the invention is not limited to those metals in particular, but may be useful in the fabrication of any metals which are difficult to work or fabricate at high temperature. These include almost all of the transition metal elements belonging to columns III B, IV B, V B, VI B, VII B, and VIII of the periodic table, and their alloys. Among the commercially important elements included in the transition metals are titanium, zirconium, niobium, tantalum, chromium, molybdenum, tungsten, rhenium, iron, osmium, cobalt, rhodium, iridium, nickel, palladium, and platinum. Their alloys include stainless steels, heat-resistant superalloys, refractory alloys, and others.

The present invention is also applicable to a metallic anisotropic material which tends to break apart when cast and rolled in the normal manner. Beryllium is one example of such a material.

Further, the present invention is applicable to special compositions, such as dispersion-strengthened alloys and mixtures of metal elements and non-metallic compounds which are usually made only by powder-metallurgy processes.

It is contemplated that the principles of the present invention will apply to materials which are hard-to-work at high temperatures. Herein, a "high temperature" is a temperature which exceeds 50% of the absolute melting point of the material. In general, the workability of metals and alloys increases with increasing temperature. However, there is no single standard or universal test which can be used to determine how a given material will behave during fabrication or working involving tensile stresses at high temperatures. For the purposes of the present invention, hot-tensile tests provide an adequate measurement of workability. Such tests provide quantitative data which indicate behaviour varying from brittle to highly ductile. A convenient indicator of workability of a metal at a given temperature is the percentage reduction-in-area-at-fracture. To illustrate, it is already known that superalloys exhibiting reduction-in-area-at-fracture of 30% or less in hot-tensile tests are characterized by poor hot-workability, and those exhibiting reductions of greater than 50% are characterized by good hot-workability. Superalloys and other materials having reduction-in-area-at-fracture of less than 50% are considered hard-to-work, and are therefore in the category to which the techniques of the present invention are especially adapted.

The punch and die utilized in the present invention are formed from materials which are substantially more ductile and workable than the material of the consolidated powder when essentially fully dense. The reduction-in-area-at-fracture of the punch and die materials are preferably at least 10% greater than that of the material of the consolidated powder at temperatures within the working range of the compressing step. The punch and die materials must have sufficient strength and rigidity to effectively transfer stresses directly to the powder mass at the temperatures employed during compressing. The flow strength of the punch and die materials is preferably not less than one-third nor greater than three times the flow strength of the consolidated powder material at the rolling temperature. The punch and die may be formed from the same or different materials, and metals are preferred.

Among the advantages of the present invention are that the consolidated powder product is characterized by uniform high density, high purity, and freedom from cracks. The method is particularly adapted to the processing of metals which have low ductility and are therefore difficult to work. The process is easily adapted to conventional rolling mills because the powder is enclosed in a heat-retaining assembly whereby the temperature of the powder remains in a narrow range even when the rolls are at a much lower temperature. The process is very efficient with much less waste of material than most conventional rolling and forging methods and other powder-metallurgy processes. Further, the technique of the present invention is simple to perform, and does not require an operator having special metal-working skills.

The large-area, plate-like product may consist either of a single consolidated powder layer or a metallurgically bonded laminate of several layers of consolidated powder and other metal. One or more auxiliary plates, such as a sheet, screen, or rod, may be disposed adjacent or within a powder layer, if desired. The punch and die may be rectangular, circular, or some complex shape in order to obtain a desired configuration in the final product. The consolidated powder product can be made to conform to particular characteristics by employing a mixture of powders including a number of different metal elements or alloys in uniform or graduated concentrations. The metal powder may contain a substantial fraction of non-metallic elements or compounds. The assembly protects the enclosed powder from oxidation or other undesirable chemical reactions. The powder may be purified in the assembly, whereby the consolidated powder product contains lesser amounts of non-metallic impurities than the starting powder.

Although having many applications, the process and product of the present invention are particularly adapted to the making of sputtering targets of chromium and other hard-to-work materials, in that the final product may comprise a large-area layer of consolidated powder having a specific composition and bonded to an intermediate layer or directly to a backing layer of stainless steel or other easily machinable material.

These and other objects, features, and advantages of the invention will be apparent from a detailed study of the specification hereinafter with reference to the attached drawings.

DESCRIPTION OF THE PREFERRED EMBODIMENTS

Figure 1:
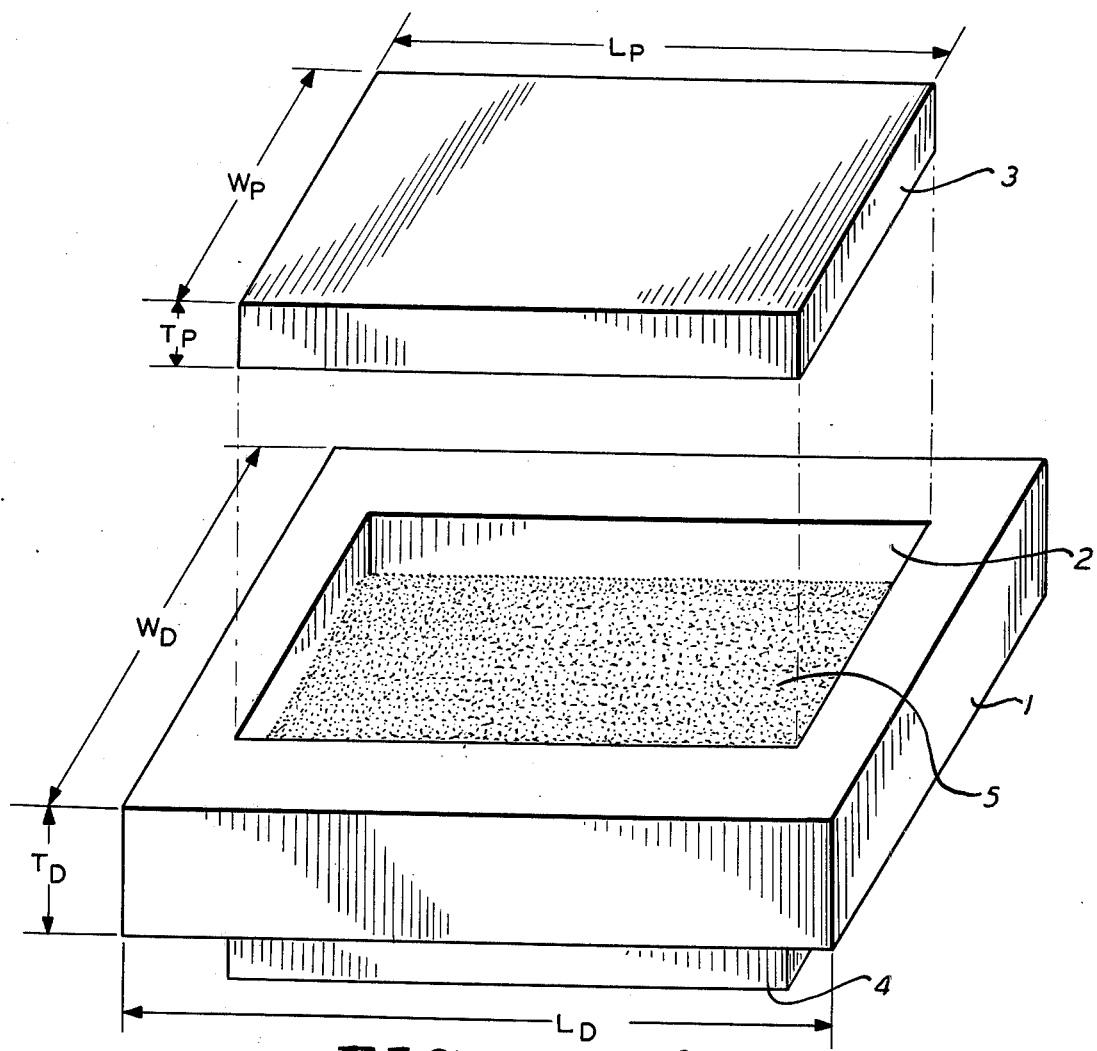
FIG. 1 is a schematic perspective view of a punch and die set of the type used for the process of the present invention, indicating the length, width, and thickness of each of the parts.

FIG. 1 of the drawings shows a preferred form of a punch and die suitable for the purpose of the present invention. Die 1 has a cavity 2 which is rectangular with sides parallel to the external walls of the die. The overall length, width, and thickness of the die are designated $L_D$, $W_D$, and $T_D$, respectively. Two substantially identical punches, 3 and 4, are shown in FIG. 1. However, the two punches need not be identical nor rectangular, and a single punch may be used. For simplicity of description, punches 3 and 4 are treated as identical, as they are in all but one of the Examples. The length, width, and thickness of the punches are designated $L_P$, $W_P$, and $T_P$, respectively. In the preferred embodiment, $L_P$ and $W_P$ of each punch are slightly less than the length and width of cavity 2, respectively.

In the first method steps, punch 4 is disposed into one end of cavity 2, the cavity is partially filled with a layer of powder 5, and punch 3 is aligned for penetration into the cavity from the opposite end, as shown in FIG. 1.

Preferably, the enclosed powder is compacted in a preliminary step. The preferred method, designated the "floating die method", is to apply pressure to the punch or punches with a conventional hydraulic press to compact the powder to a density typically 65% of the theoretical maximum density. Higher density is obtainable only by applying much higher pressure. The floating die method is preferred because it provides uniform density throughout the powder mass.

Figure 2:
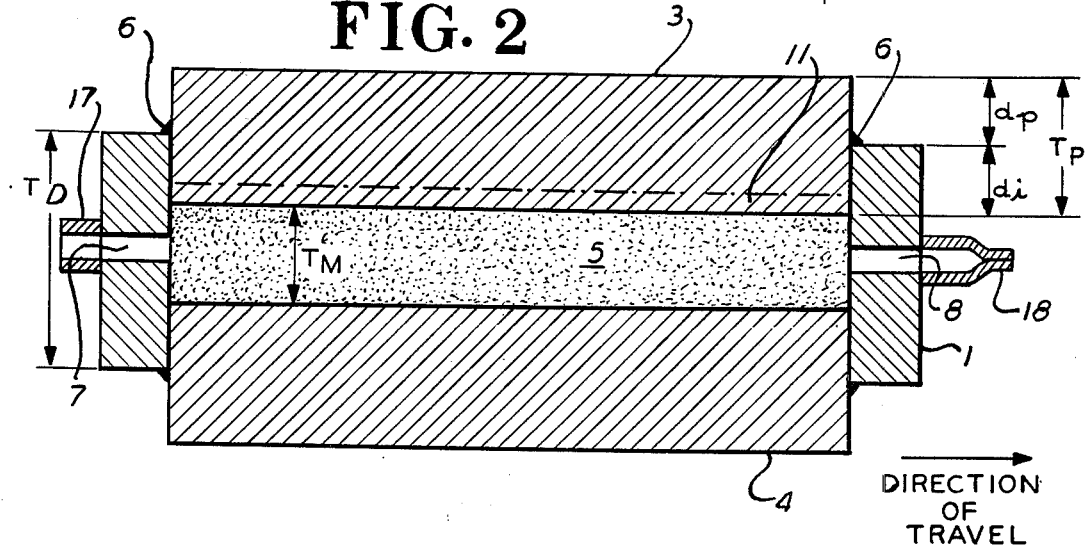
FIG. 2 is a longitudinal sectional view of the powder-filled punch and die set of FIG. 1, after the punches have been inserted from opposite ends and welded into position for hot-rolling.

Next, the punches are fixed in place to prevent disassembly of the punch and die during subsequent steps, particularly during rolling. Preferably, punch 3 is fixed in place by a weld 6 between the periphery of the punch and the rim of cavity 2 at one end of die 1, as shown in FIG. 2. Similarly, punch 4 is welded to the other end of die 1. Each weld forms a convenient vacuum-tight seal, if such is desired for subsequent steps. The welding is done in a conventional manner using welding electrodes, preferably having a composition which approximates those of the materials of the punch and die. However, any weld metal which forms a secure bond between the punch and die, and which has a similar coefficient-of-expansion in the temperature range of the compressing step is suitable.

Optionally, the chemical composition of the enclosed powder mass is modified by flowing a reactive gas through the punch and die assembly. As shown in FIG. 2, one or more entrance openings 7 and one or more exit openings 8 are provided in the walls of the die through which the reactive gas can flow. Typically, the assembly is heated in a protective atmosphere, such as argon, and the temperature is maintained between 1100° and 1300° C. for 2 to 20 hours while a chemically reducing gas, such as dry hydrogen, flows through the openings at a rate of 5 to 50 liters per minute. The reducing gas flows through the porous network in the powder, and decreases the carbon, oxygen, nitrogen, sulphur, and other non-metallic interstitial impurities to relatively very low levels. In order to facilitate purification, the density of the compacted powder is preferably less than 75% of the theoretical maximum density so as to provide a continuous network of pores. Usually there is no interconnected porosity for densities exceeding 85% of maximum. If desired, the purification step can be omitted or carried out separately prior to compacting the powder in the punch and die assembly.

Preferably, the enclosed powder is outgassed by connecting a tube 17 from one opening 7 to a vacuum pump, sealing any other openings, and evacuating the assembly for about an hour while maintaining the temperature at about 600° C. The remaining opening is completely sealed before the vacuum pump is removed. An opening may be sealed by making a crimp 18 in a tube connected to the opening. Thus, the powder layer is sealed inside the assembly where it is protected from oxidation during storage, heating, and compressing. If the powder is not subject to oxidation or other adverse reaction, it is not necessary to seal the enclosure.

Just prior to the compressing step, the upper punch 3 intrudes a distance $d_i$ into the cavity 2 of die 1, and protrudes a distance $d_p$, as shown in FIG. 2. Each distance $d_i$, $d_p$ is measured from the upper end of the die. Punch 4 intrudes and protrudes from the lower end of the die in a similar manner. The total distance P which the two punches protrude from the die is the sum of the protrusion distances of each punch. Normally, the protrusion distance for punch 4 is approximately equal to that for punch 3, and the total distance P which the two punches protrude from the die is $d_p + d_p = 2d_p$. The thickness of the layer of powder between the punches is designated $T_M$.

Intrusion of the punch into the die facilitates enclosure of the powder. The intrusion ratio $i = d_i/d_p$ required to keep the punch from being forced out of the die by initial contact with a roll in the compressing step increases as the roll diameter decreases. Use of intrusion ratios much larger than the required minimum increases the difficulty in transmitting applied pressure to the powder layer. Typically, the roll diameter is about 20 in and the intrusion ratio is about 1. Many conventional rolling mills have roll diameters from 35 to 7 in, and the preferred range for the intrusion ratio is from 0.5 to 2.

The temperature and pressure applied during the compressing step must be sufficient to consolidate the powder. In the case of chromium or chromium-alloy powders, the temperature should be in the range 1100° to 1300° C., and preferably about 1200° C. Preferably, the dimensions of the assembly and the roll gap for the first pass are such that the punches are depressed so as to compress the powder to at least 90% of the theoretical maximum density before the assembly is substantially elongated.

The total protrusion distance P required to obtain the desired densification of the powder increases as the thickness $T_M$ increases. It is preferred to keep the protrusion ratio $p = P/(1-\rho c)T_M$ greater than 1. Here, $\rho_c$ is the density of the compacted powder expressed as a fraction (rather than a percentage) of the theoretical maximum density. Usually, values of $p$ less than 1 do not produce sufficient densification unless the gap ratio $g$ is significantly less than 1 and the thickness of the die is substantially reduced. Usually, $p$ must be at least 1.2 in order to obtain 90% density in a single pass with a gap ratio $g$ of about 1. A value of $p$ greater than 2 does not provide any advantage.

Figure 3:
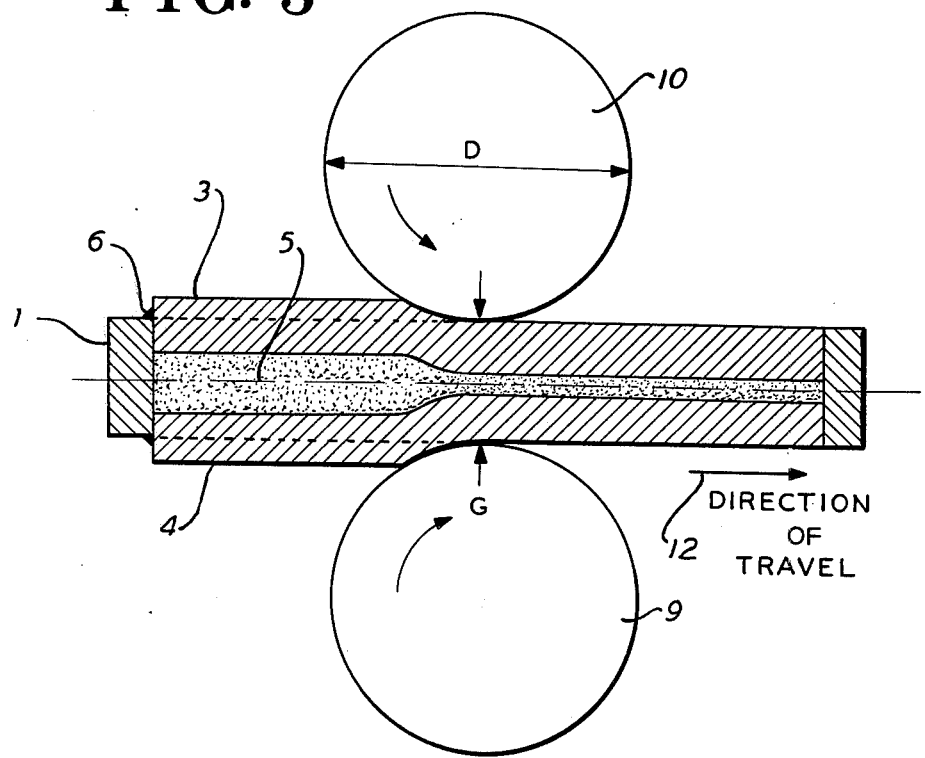
FIG. 3 is a longitudinal sectional view of the powder-filled punch and die assembly of FIG. 2 in the course of passing through a rolling mill.

FIG. 3 shows the assembly of FIG. 2 in the course of passing through a rolling mill. The rolls 9 and 10 have diameter D and are separated by a gap distance G. With the rolls rotating in the direction indicated, the assembly moves in the direction of the arrow 12. Preferably, the roll gap for the first pass is approximately the thickness of the die, as shown, whereby the gap ratio is about 1. The punches are compressed substantially flush with the surface of the die, but the thickness of the die and the elongation of the powder are essentially unchanged.

Preferably, the assembly is rolled a second time, at about the same temperature, but with a gap ratio significantly less than 1, whereby the thickness of the assembly is reduced substantially. The resulting shear stresses cause substantial elongation and further densification of the consolidated powder layer. Typically, the second pass gap ratio is 0.85 or less and the die thickness is reduced at least 15%. The ultimate lower limit on $g$ is set by the capability of the rolling mill. It is well known in the rolling art that greater forces and torques are required to produce greater reductions in thickness.

It is understood that only one or more than two rolling passes may be employed if deemed necessary to produce the desired density and dimensions in the final powder-compacted product. Further, the hot-rolling may be preceded by hot pressing with a sufficiently large hydraulic press. In such a case, the protrusion ratio p is preferably greater than 1.2 in order that the powder is compressed to a density greater than 90% before it is subjected to shearing forces resulting from elongation of the die.

After compressing, the composite product is cooled relatively slowly in order to minimize residual stresses generated by differences between the coefficient of thermal expansion of the consolidated powder layer and that of the remnants of the punch or die. Typically, the cooling rate is 100 deg/hr or less. If the powder contains chromium and the punch iron, the cooling rate is increased to about 1000 deg/hr from about 850° C. to 650° C., in order to avoid the formation of an undesirable brittle intermetallic phase, known as the sigma phase, at the interface. In such case, the cooling rate is reduced to 100 deg/hr or less between 650° C. and room temperature in order to minimize residual stresses. The rate of cooling may be varied in each case to take into account the relative coefficients of thermal expansion of the components, and to minimize residual stresses and resultant cracking.

Finally, the composite product is cut and machined to the desired dimensions. In order to prevent cracking, the stresses generated during these operations are minimized. The remnants of the punches and die can be removed or retained as desired. Usually, the consolidated powder and the remnants are strongly bonded together. The largest consolidated powder plates which have been made have areas of about 100 in$^2$, but it is believed that much larger plates can be made by this method.

Figure 4:
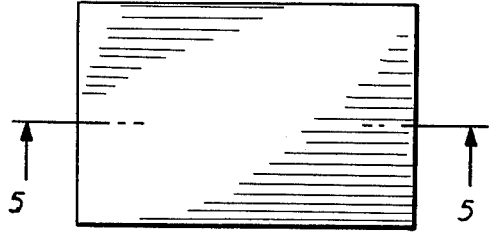
FIGS. 4 and 5 are plan and sectional views, respectively, of a typical sputtering target formed by the process of the present invention.
Figure 5:
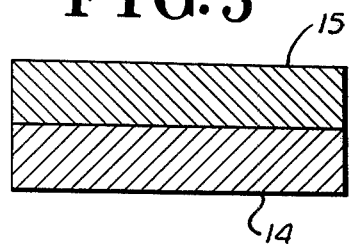

FIGS. 4 and 5 are plan and sectional views of a sputtering target made by the method of the present invention. Layer 15 is a dense layer of consolidated chromium or chromium-alloy powder and layer 14 is a backing layer which is derived from a stainless steel punch. The backing layer is easily drilled and tapped to facilitate mounting of the target.

Figure 6:
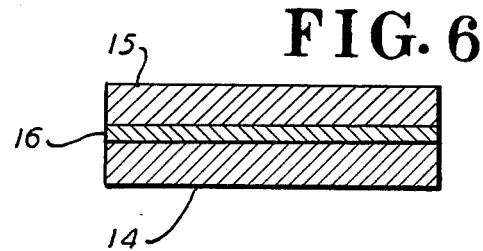
FIG. 6 shows, in section, an alternative product in which an intermediate layer is interposed between a backing layer and a consolidated powder layer.

FIG. 6 shows a sectional view of an alternative composite product which includes an intermediate layer 16 between backing layer 14 and consolidated powder layer 15. Such an intermediate layer can provide a stronger bond between particular consolidated powder and backing layer materials. Intermediate layer 16 is derived from an auxiliary plate 11, shown by a broken line in FIG. 2, interposed between one punch and the powder at the time the assembly is formed. Typically, the auxiliary plate is 0.06 to 0.12 thick and replaces a portion of the thickness of upper punch 3, so that the combined thickness substantially equals that of lower punch 4.

The invention will be more completely understood from a discussion of the following specific examples of its application.

EXAMPLES

For all of the examples, a rectangular die was formed from 304 stainless steel. Except for Example 5, all of the dies had the shape shown in FIG. 1. For each example, the inital length, width, and thickness of the die are indicated in Table II as $L_D$, $W_D$, and $T_D$ in the row for "0" passes.

For all except Examples 5 and 8, two identical punches of the shape indicated in FIG. 1 were used. As will be discussed subsequently, Example 5 involved only one punch and Example 8 involved a first punch and an auxiliary plate which combined had the same shape and size as a second punch. For all examples, the initial length and width of the punches are indicated in Table II as $L_P$ and $W_P$ in the row for "0" Passes. The initial thickness $T_P$ for each punch is indicated in Table I.

For Examples 1, 5, 6, and 7 the punches were formed from 304 stainless steel. The punches for Examples 2 and 8 were 347 stainless steel. The punches for Examples 3 and 4 were formed from a nickel-base material sold by the International Nickel Company under the name INCONEL 601 alloy.

In each example, a metal powder was processed as follows: a powder mass of weight w and initial density $\rho_i$, as indicated in Table I, was placed into the cavity of a metal die as shown in FIG. 1, and enclosed by disposing at least one punch to partially penetrate into the cavity.

The enclosed powder was compacted by the floating die method without heating; pressure was applied to the punch with a hydraulic press until the powder had density $\rho_c$, as given in Table I. This compaction was accomplished without apparent change in the dimensions of any punch. Thus, for each example, the length, width, and thickness of the compacted powder were equal to $L_P$, $W_P$ and $T_M$ as indicated in the row for "0" Passes in Table II.

After compaction, each punch intruded a distance $d_i$ into the die and protruded a distance $d_p$ out of the die, as indicated in Table I and FIG. 2. The punches were fixed in that position by welding with stainless steel electrodes to interpose weld metal between the punches and the die, forming peripheral weld 6 as shown in FIG. 2. The intrusion ratio i and the protrusion ratio p of the resulting assembly are given in Table I.

The compacted powder was outgassed by heating the assembly to 600° C. or slightly above for about 1 hour while evacuating the assembly to a pressure of 25 millitorr or slightly less. For all but Example 8, die 1 had a single opening 7 which was fitted with a stainless steel tube 17 having an inside diameter of 0.125 in. The tube was connected to a conventional vacuum pump while the powder was outgassed. After cooling to room temperature, the assembly was sealed by crimping the tube before the vacuum pump was disconnected.

The assembly comprising the die, punches, and compacted powder was then heated and compressed by passing one or more times between two rolls as shown in FIG. 3. Sometimes the assembly was re-heated and re-rolled as would be required in most finishing processes. Table II indicates the number of passes, the approximate temperature, and the roll diameter D, for each rolling sequence for each example. The roll gap G and the gap ratio g for the first pass are also indicated. The approximate exterior dimensions of the assembly at the end of each sequence are indicated under $L_D$, $W_D$, and $T_D$. Similarly, where known, the dimensions of the enclosed powder layer are indicated under $L_P$, $W_P$, and $T_M$. The final density $\rho_f$ of the consolidated powder layer is indicated in Table I.

EXAMPLE 1

In this example, the powder layer was commercially pure chromium powder designated M-788 by Shieldalloy Corporation, the supplier. A chemical analysis indicated the following additional metallic constituents by weight: 0.28% Al, 0.22% Fe, and 0.12% Si. The non-metallic impurities were 223 ppm C, 1655 ppm O, 88 ppm N, and 187 ppm S. The theoretical maximum density is 0.260 lb/in$^3$ (7.19 g/cm$^3$). The crushed powder had a particle size smaller than 60 mesh. The powder was enclosed in a die with a pair of identical punches, cold-compacted by the floating die method, outgassed, and sealed under vacuum. Three assemblies designated 1A, 1, and 1B were prepared, all having the same die and cavity dimensions but with different intrusion and protrusion ratios, as indicated in Table I. Each assembly was consolidated by heating and rolling as indicated in Table II, and then cooled to room temperature. The stainless steel layer derived from one punch was carefully cut away to allow examination of the surface of the consolidated powder layer.

The parameters of assembly 1 gave the best results: the final density $\rho_f$ was 95% of the theoretical maximum density and the consolidated chromium had the fewest cracks. These superior results are attributed to the combination of an intrusion ratio $i = 2.54$, a protrusion ratio $p = 1.28$, and a first pass gap ratio $g = 1.02$. Because the roll gap for the first pass was approximately equal to the initial thickness of the die, the protruding ends of each punch were depressed essentially flush with the surfaces of the die.

The parameters of assembly 1A are less satisfactory than those of assembly 1 or 1B because the punches popped out of the die during the first pass through the rolls. This is attributed to the use of an intrusion ratio $i = 0.5$ which is too small for the relatively small-diameter rolls. Further, even though the protrusion ratio $p = 3.13$ was quite large, the final density was only 74% because the gap ratio $g = 1.5$ was so much greater than 1.

These three assemblies demonstrate that in order to obtain a high-density, crack-free chromium product, the intrusion ratio $i$ must be greater than 0.5 for 10-in diameter rolls, and the protrusion ratio $p$ and the gap ratio $g$ should not both be near 1.

EXAMPLE 2

The powder was a uniform mixture of 89% by weight of the chromium powder of Example 1 and 11% by weight of iron powder of grade Atomet 29, manufactured by the Quebec Metal Powder Company, Montreal, Quebec, Canada. The iron powder had a particle size less than 100 mesh. The theoretical maximum density is 0.263 lb/in$^3$ (7.26 g/cm$^3$). The powder was enclosed, compacted, outgassed, and sealed. Three different assemblies, designated 2A, 2, and 2B, were prepared having essentially the same dimensions and weight of powder as indicated in Tables I and II. The intrusion ratio $i$ was about 1.1 and the protrusion ratio $p$ was about 1.8 for all three assemblies.

Assembly 2A was heated and rolled once with a gap larger than the thickness of the die and a gap ratio $g = 1.07$. The thickness of each punch was reduced 10%, to 0.694 in, but the punches were not depressed flush with the ends of the die. The resulting density of the consolidated powder was only 82% of the theoretical maximum.

Assembly 2 was heated and rolled as assembly 2A except that the roll gap was approximately equal to the thickness of the die and the gap ratio was 0.97. The thickness of each punch was reduced 16% to 0.653 in, and the punches were depressed flush with the ends of the die. The final density was 90%.

Assembly 2B was heated and rolled as assembly 2 except that the gap was significantly less than the thickness of the die, the gap ratio was 0.88, and the thickness of each punch was reduced 21% to 0.607 in. Not only were the punches depressed flush with the die, but the thickness of the die itself was reduced 13% and the length was increased 18%. The final density was 95%.

These three assemblies indicated that for a given protrusion ratio, the density after a single pass increases as the roll gap decreases.

EXAMPLE 3

The powder was chromium of the composition and size as for Example 1. The powder was enclosed, compacted, outgassed, and sealed. The assembly was heated and rolled once. As can be calculated from the data given in Table II, the powder thickness decreased 43%, each punch thickness decreased 15% to 0.636 in, but the die thickness decreased only 3%. The length and width of the die increased 16% and 3%, respectively, and the length and width of the powder mass increased 18% and 3%. Compared to the increases in length and width, the much greater percentage decrease in thickness of the powder indicates that powder experienced much greater compressive than shearing stresses during the first rolling. One of the two punches was removed for examination of the surface of the consolidated powder. The powder density was 95% and there were no visible surface cracks. This success is attributed to the combination of an intrusion ratio $i = 0.91$ which is sufficiently high for 20-in diameter rolls, a protrusion ratio $p = 1.81$, a gap ratio $g = 1.00$, and a rolling temperature high enough for consolidation of the chromium powder but low enough that the INCONEL 601 punches had sufficient strength to transmit compression stresses to the powder.

After the removed punch was replaced and re-welded, the assembly was heated and rolled again. One pass was made parallel to the length and one parallel to the width of the assembly. The two passes increased the length and width of the consolidated powder layer by 75% and 9%, respectively, and decreased the thickness by 54%. The much larger elongation compared to the reduction in thickness indicates that the consolidated powder experienced substantial shear stresses. From the dimensions, the final density $\rho_f$ was estimated to be 99%. This was confirmed by metallo-graphic examination of a 8.5 × 7 in piece sawed from the center of the assembly. The examination revealed that the powder product was crack-free with a density of between 98% and 99%. The excellent quality of the final powder product indicates that an assembly containing consolidated chromium powder of density 95% can undergo further elongation and thickness reduction without cracking.

EXAMPLE 4

The powder was a uniform mixture of 88% chromium and 12% iron powders similar to Example 2. The powder was enclosed, compacted, outgassed, and sealed. The assembly was heated and rolled three times in rapid succession with a first pass gap ratio $g = 1.00$, a protrusion ratio $p = 1.89$, and an intrusion ratio $i = 1.05$. Removal of one punch revealed that the density of the powder product was 99% and that there was no observable cracks. The punch was replaced and the assembly re-rolled twice as in Example 3. Metallographic examination of a microsection of the consolidated powder showed it to be crack-free and of density between 98% and 99% of maximum. This example illustrates that once a high density is obtained, consolidated chromium-iron powder can undergo elongation and reduction in thickness without cracking.

EXAMPLE 5

The powder was FerroTic compound sold by the Sintercast Division of Chromalloy Corporation. This compound comprises an iron-based matrix with 45% by volume titanium carbide. The powder contained the following non-metallic elements by weight: 9.86% C, 1.89% O, and 1416 ppm N. The theoretical maximum density is 0.227 lb/in$^3$ (6.4 g/cm$^3$). The powder size was less than 325 mesh.

The die was a modified version of that of FIG. 2 in which punch 4 was replaced by a closed end. Because only a single punch 3 was used, the total protrusion distance $P = d_p$. The die was 1.292 in thick and the cavity was 0.854 in deep. After compacting, punch 3 was removed to expose the powder. The exposed powder was purified by maintaining the die and powder at approximately 1177C for 6 hours in a dry hydrogen atmosphere (dewpoint −36° C.). After the powder had cooled without oxidation, the punch was reinserted and the assembly was outgassed and sealed.

The assembly was heated, rolled twice, then reheated and re-rolled twice. A metallographic examination after cooling indicated no apparent cracks. The non-metallic elements were found to be 6.3% C, 0.93% O, 567 ppm N, and 200 ppm S. The success of this example indicates both that the single-punch method is workable and that powders containing a substantial fraction of a very hard-to-work, non-metallic compound such as titanium carbide, can be formed into plates by the method of this invention.

EXAMPLE 6

The powder was a uniform mixture of 88% chromium and 12% iron powders similar to Example 2. The non-metallic impurities of the mixture were 243 ppm C, 1600 ppm O, 100 ppm N, and 204 ppm S. The powder was enclosed, compacted, outgassed, and sealed. The punch and powder parameters after compacting are indicated in Table I in the upper row for Example 6; the density of the powder was 63%.

The assembly was heated, but rather than being rolled, it was pressed using a hydraulic press capable of exerting a force of 1300 ton. Despite the use of applied pressures of 40,000 lb/in$^2$, the powder density after two hot-pressings was estimated to be only 86%. Even this uncommonly large press was incapable of increasing the density of the approximately 60 in$^2$ layer to 90%. The punch and powder parameters after hot-pressing are indicated in Table I in the lower row for Example 6. The pressing temperature and the dimensions of the die and powder after pressing are indicated in the row of Table II in which "Press" appears in the "Roller" column. Next, the assembly was heated and rolled in two sequences as indicated in Table II. The final area of the consolidated powder layer was about 114 in$^2$ and the density $\rho_f$ was 98%. The rolling mill accomplished what the giant hydraulic press could not.

A chemical analysis of the consolidated powder layer indicated that the non-metallic impurities were 284 ppm C, 1634 ppm O, 110 ppm N, and 158 ppm S, which indicate that the interstitial impurity content remained essentially the same throughout the processing. Thus, the punch and die enclosure effectively sealed the powder from the atmosphere during storage of the assembly and throughout the subsequent heating and compressing steps.

EXAMPLE 7

The powder was chromium of the composition and size as for Example 1. The powder was enclosed, compacted, outgassed, and sealed. The assembly was rolled once with a relatively narrow gap and a gap ratio $g = 0.72$. The die thickness decreased 43% and the length and width of the assembly increased 34% and 6.5% respectively. This thickness reduction is significantly greater than that made on the first pass in the other examples. An acceptable product with a final density $\rho_f$ of 96% was obtained. However, several passes with smaller thickness reductions are preferred in order to make larger-area plates.

EXAMPLE 8

The powder was a prepared alloy comprising chromium, 23.4% iron, less that 1% other metallic elements, and non-metallic impurities of 291 ppm C, 4322 ppm O, 653 ppm N, and 31 ppm S. The powder was enclosed as shown in FIG. 1; punch 4 was 0.75 in thick, and punch 3 was 0.625 in thick. A rectangular auxiliary plate 11, shown in FIG. 2, of INCONEL 601 alloy having dimensions $4 \times 7 \times 0.125$ in, was placed between punch 3 and the powder mass 5. The combined thickness of punch 3 and auxiliary plate 11 was equal to that of punch 4. In this example, the single openings 7 and 8 shown in FIG. 1 were each replaced by four parallel openings in order to more uniformly distribute flowing gas through the powder mass.

After the powder was compacted, it was chemically reduced by flowing dry hydrogen (dewpoint $-65°$ C.) through the assembly at about 5 liters/minute. While the hydrogen was flowing, the assembly was slowly heated, held at 1200° C. for approximately 15 hours and cooled to room temperature. The assembly was outgassed, sealed, heated and rolled twice. Then it was cooled slowly to about 760° C. at a rate of 110 deg/hr, cooled quickly to 650° C. to avoid formation of the sigma phase, and cooled slowly to room temperature at a rate of about 28 deg/hr. A chemical analysis of the consolidated powder layer indicated that the purification step reduced the non-metallic impurities by significant amounts to 64 ppm C, 1547 ppm O, 46 ppm N, and 10 ppm S.

The composite was cut to form an $8 \times 4$ in sputtering target as shown in FIG. 6. The intermediate layer 16, derived from the INCONEL 601 auxiliary plate, was firmly bonded both to the chromium-iron consolidated powder layer 15 and the 347 stainless steel backing layer 14. The target was mounted to a planar magnetron sputtering source and successfully sputtered to deposit a thin layer of chromium-iron alloy on a substrate.

Although the invention has been described with reference to a number of specific examples, the invention is not limited to any of the particular forms or materials disclosed by way of illustration, but only as defined in the claims.

TABLE I

PUNCH PARAMETERS[a] AND POWDER DENSITY

| Ex. | $T_P$ (mil) PUNCH | $d_f$ (mil) | $d_p$ (mil) | i | p | w (lb) | $\rho_i$ (%) | $\rho_c$ (%) | $\rho_f$ (%) |
|---|---|---|---|---|---|---|---|---|---|
| 1A | 750 | 250 | 500 | 0.50 | 3.13 | 4.04 | 51 | 58 | 74 |
| 1 | 500 | 359 | 141 | 2.54 | 1.28 | 3.16 | 51 | 60 | 95 |
| 1B | 500 | 400 | 100 | 4.00 | 1.05 | 2.81 | 51 | 60 | 92 |
| 2A | 767 | 398 | 369 | 1.08 | 1.79 | 8.82 | 55 | 66 | 82 |
| 2 | 775 | 409 | 366 | 1.11 | 1.86 | 8.82 | 55 | 67 | 90 |
| 2B | 773 | 412 | 361 | 1.14 | 1.84 | 8.82 | 55 | 67 | 95 |
| 3 | 750 | 358 | 392 | 0.91 | 1.81 | 8.00 | 55 | 66 | 98 |
| 4 | 750 | 384 | 366 | 1.05 | 1.89 | 8.04 | 55 | 69 | 99 |
| 5 | 500 | 200 | 300 | 0.67 | 1.02[b] | 2.95 | 40 | 55 | 95 |
| 6[c] | 750 | 368 | 382 | 0.96 | 1.52 | 12.60 | 54 | 63 | — |
|  | 639 | 514 | 125 | 4.11 | 2.12 | — | — | 86 | 98 |
| 7 | 500 | 334 | 166 | 2.01 | 1.52 | 4.13 | 54 | 65 | 96 |
| 8 | 750[d] | 375 | 375 | 1.00 | 1.58 | 5.80 | 55 | 62 | 99 |

[a] 1 mil = $10^{-3}$ in.
[b] Single punch.
[c] Upper row, before pressing; lower row, after pressing.
[d] Punch and auxiliary plate combined.

TABLE II

HEATING AND ROLLING PARAMETERS

| Example | Passes | Temp. (C) | ROLLER D (in) | ROLLER G (in) | g | DIE $L_D$ (in) | DIE $W_D$ (in) | DIE $T_D$ (in) | POWDER $L_P$ (in) | POWDER $W_P$ (in) | POWDER $T_M$ (in) |
|---|---|---|---|---|---|---|---|---|---|---|---|
| 1A | 0 | 1180 | 9.63 | 1.87 | 1.50 | 8.5 | 7.0 | 1.25 | 6.0 | 6.0 | 0.75 |
|  | 1 |  |  |  |  | 9.0 | 7.06 | 1.25 | 6.9 | 6.0 | 0.50 |
| 1 | 0 | 1180 | 9.63 | 1.3 | 1.02 | 8.5 | 7.0 | 1.281 | 6.0 | 6.0 | 0.563 |
|  | 2 |  |  |  |  | 10.0 | 7.12 | 1.07 | 7.5 | 6.5 | 0.263 |
| 1B | 0 | 1180 | 9.63 | 1.25 | 0.97 | 8.5 | 7.0 | 1.29 | 6.0 | 6.0 | 0.49 |
|  | 1 | 1180 |  | 0.84 |  | 9.53 | 7.0 | 1.21 | 6.62 | 6.03 | 0.339 |
|  | 1 |  |  |  |  | 13.31 | 7.13 | 0.844 | 9.18 | 6.25 | 0.203 |
| 2A | 0 | 1210 | 20 | 2.15 | 1.07 | 10.00 | 11.00 | 2.008 | 6.00 | 7.00 | 1.212 |
|  | 1 |  |  |  |  | 10.56 | 11.42 | 1.997 | 6.57 | 7.07 | 0.766 |
| 2 | 0 | 1210 | 20 | 1.94 | 0.97 | 10.00 | 11.00 | 2.012 | 6.0 | 7.0 | 1.194 |
|  | 1 |  |  |  |  | 11.05 | 11.44 | 1.940 | 6.96 | 7.17 | 0.634 |
| 2B | 0 | 1210 | 20 | 1.76 | 0.88 | 10.0 | 11.0 | 2.010 | 6.0 | 7.0 | 1.187 |
|  | 1 |  |  |  |  | 11.75 | 11.57 | 1.758 | 7.35 | 7.24 | 0.544 |
| 3 | 0 | 1205 | 20 | 2.0 | 1.00 | 9.5 | 10.5 | 2.010 | 5.500 | 6.500 | 1.294 |
|  | 1 | 1205 |  |  |  | 11.0 | 10.8 | 1.942 | 6.516 | 6.703 | 0.743 |
|  | 2 |  |  |  |  | 19.0 | 12.5 | 0.967 | 11.42 | 7.31 | 0.343 |
| 4 | 0 | 1205 | 20 | 2.0 | 1.00 | 9.5 | 10.5 | 2.010 | 5.500 | 6.500 | 1.242 |
|  | 3 | 1205 |  |  |  | 13.1 | 11.0 | 1.598 | 8.156 | 6.750 | 0.562 |
|  | 2 |  |  |  |  | 17.3 | 13.5 | 0.975 | 10.5 | 8.5 | 0.344 |
| 5 | 0 | 1205 | 20 | 1.25 | 0.96 | 8.5 | 7.0 | 1.292 | 6.0 | 6.0 | 0.654 |
|  | 2 | 1205 |  |  |  | 11.0 | 8.5 | 1.015 | — | — | — |
|  | 2 |  |  |  |  | 14.0 | 8.5 | 0.681 | — | — | 0.172 |
| 6 | 0 | 1190 | Press 16 | 1.75 | 0.83 | 10.5 | 9.5 | 2.100 | 7.5 | 7.5 | 1.364 |
|  | 2 | 1177 |  |  |  | 12.1 | 11.0 | 2.13 | 8.13 | 8.13 | 0.850 |
|  | 2 | 1177 |  |  |  | 13.8 | 12.5 | 1.56 | — | — | — |
|  | 2 |  |  |  |  | 17.0 | 13.0 | 1.25 | 12.0 | 9.5 | — |
| 7 | 0 | 1210 | 20 | 0.93 | 0.72 | 8.50 | 7.25 | 1.292 | 6.0 | 6.5 | 0.624 |
|  | 1 |  |  |  |  | 11.75 | 7.72 | 0.93 | — | — | — |
| 8 | 0 | 1210 | 20 | 1.77 | 0.88 | 7.0 | 9.0 | 2.0 | 4.0 | 7.0 | 1.25 |
|  | 2 |  |  |  |  | 17.0 | 9.5 | 0.826 | — | — | — |

What is claimed is:

1. A method of manufacturing a plate from a metal powder which comprises the steps of:

placing a layer of the powder inside a die having a cavity which has an opening at an end of the die;

disposing a punch into the opening so as to partially intrude and partially protrude from the end of the die, and to enclose the powder in an assembly comprising the punch and die;

heating the assembly to a temperature sufficient to allow consolidation of the powder; and compressing the heated assembly by rolling to apply pressure to the punch to consolidate and elongate the layer of powder.

2. The method in accordance with claim 1 further comprising the steps of:

applying pressure to the punch to compact the enclosed powder; and then fixing the punch to the die to prevent disassembly during rolling.

3. The method in accordance with claim 2 further comprising the steps of:

evacuating the assembly to outgas the compacted powder; and sealing the evacuated assembly prior to the heating and compressing steps.

4. The method in accordance with claim 3 further comprising the step of flowing a chemically reducing gas through the assembly prior to the evacuating step to decrease the amounts of non-metallic impurities in the enclosed powder.

5. The method in accordance with claim 1 wherein the metal of the powder is selected from the group consisting of titanium, zirconium, niobium, tantalum, chromium, molybdenum, tungsten, rhenium, iron, osmium, cobalt, rhodium, iridium, nickel, palladium, and platinum, and their alloys.

6. The method in accordance with claim 1 wherein the powder consists essentially of a hard-to-work material characterized by a hot-tensile-reduction-in-area-at-fracture of less than 50% at temperatures within the working range of the compressing step.

7. The method in accordance with claim 1 wherein the punch and die are formed from metals which have hot-tensile-reduction-in-area-at-fracture at least 10% greater than the powder material, at temperatures within the working range of the compressing step.

8. The method in accordance with claim 1 wherein the flow-strength of the punch and die materials are not less than one-third nor greater than three times the flow-strength of the powder material at temperatures within the working range of the compressing step.

9. The method in accordance with claim 1 wherein the density of the consolidated powder is increased to at least 90% of the theoretical maximum by a first rolling.

10. The method in accordance with claim 1 wherein the consolidated powder has an area greater than 100 in$^2$.

11. A method of manufacturing a plate from a metal powder which comprises the steps of:

placing a layer of the powder inside a metal die having a cavity which has a first opening in a first end of the die and a second opening in a second end opposite to the first end of the die;

disposing a first metal punch into the first opening so as to partially intrude and partially protrude from the first end of the die;

disposing a second metal punch into the second opening so as to partially intrude and partially protrude from the second end of the die, and to enclose the powder in an assembly comprising the first punch, second punch, and die;

heating the assembly to a temperature sufficient to allow consolidation of the powder; and compressing the powder by passing the heated assembly between two rolls which apply pressure to the first punch and the second punch to consolidate and elongate the layer of powder.

12. The method in accordance with claim 11 wherein the protrusion ratio $P/(1-\rho_c)T_M$ lies in the range 1 to 2, where $P$ is the total distance which the two punches protrude from the die, $T_M$ is the thickness of the powder, $\rho_c$ is the density of the powder expressed as a fraction of the theoretical maximum density, and the quantities $P$, $T_M$, and $\rho_c$ are evaluated just prior to the compressing step.

13. The method in accordance with claim 12 wherein for each punch just prior to the compressing step, the intrusion ratio $d_i/d_p$ is within the range 0.5 to 2, where $d_i$ is the distance which said punch intrudes into the cavity and $d_p$ is the distance said punch protrudes from the end of the die.

14. The method in accordance with claim 11 further comprising the steps of:

compacting the enclosed powder by applying pressure to the first punch and the second punch;

fixing the punches to the die after the compacting step to prevent disassembly during rolling;

evacuating the assembly to outgas the compacted powder; and sealing the evacuated assembly prior to the heating and compressing steps.

15. The method according to claim 14 wherein the powder is compacted to a density not exceeding 75% of the theoretical maximum density, and the density resulting from the first rolling is at least 90%.

16. The method according to claim 15 wherein the protrusion ratio is in the range 1.2 to 2, and the gap ratio $G/T_D$ is within the range 0.95 to 1.05, where $G$ is the distance between the rolls, and $T_D$ is the thickness of the die.

17. The method of making high-density plates from a powder containing a first metal, which comprises the steps of:

placing the powder into a cavity of a die of a second metal which has a ductility substantially exceeding that of the first metal;

disposing a pair of metal punches to partially penetrate into the cavity from opposite ends of the die and to form an assembly which encloses the powder; the punches having sufficient thickness that a portion of each punch protrudes from the end of the die after the compacting step;

compacting the powder by applying pressure to the punches;

welding the punches to the die after the compacting step;

evacuating the assembly to outgas the compacted powder;

sealing the evacuated assembly with the powder under vacuum;

heating the sealed assembly to a temperature at which the powder can be consolidated;

rolling the assembly in a first pass between two rolls to depress each punch substantially flush with the ends of the die, and to consolidate the powder; and rolling the assembly in a second pass to elongate and increase the density of the consolidated powder.

18. The method in accordance with claim 17 wherein the powder is compacted to a density not exceeding 75% of theoretical maximum density by the compacting step; the density is increased to at least 90% by the first pass; and the density is increased to at least 95% by the second pass.

19. The method in accordance with claim 18 further comprising the steps of:
   flowing a chemically reducing gas through the assembly to purify the powder; and
   preventing oxidation of the powder until the assembly is sealed under vacuum.

20. The method in accordance with claim 19 wherein the powder contains chromium, the temperature of the assembly during rolling is 1100° to 1300° C., and the reactive gas is hydrogen.

21. An assembly adapted to be heated and rolled to form a composite including a layer of consolidated powder, comprising:
   a metal die having a cavity;
   at least one metal punch disposed to intrude a distance $d_i$ into the cavity and protrude a distance $d_p$ from an end of the die;
   means for fixing the punch to the die; and
   a layer of metal powder which is enclosed in the cavity by the die and the punch, and which has a thickness $T_M$ and a fractional density $\rho_c$; wherein
   the intrusion ratio $d_i/d_p$ for each punch is within the range 0.5 to 2, and
   the protrusion ratio $P/(1-\rho_c)T_M$ is within the range 1 to 2, where P is the total distance by which the punches protrude from the ends of the die.

22. The assembly in accordance with claim 21 further comprising: means for sealing the assembly so that the powder layer is under vacuum.

23. The assembly in accordance with claim 22 which includes a pair of punches disposed to intrude into said cavity from opposite ends with the powder layer between them.

24. The combination in accordance with claim 19 wherein at least one auxiliary plate is interposed between the punches.

25. The combination in accordance with claim 24 wherein the total thickness of one punch is equal to the thickness of the other punch plus the thickness of the auxiliary plate.

* * * * *